United States Patent
Yamaguchi et al.

(10) Patent No.: US 8,125,274 B2
(45) Date of Patent: Feb. 28, 2012

(54) DIFFERENTIAL AMPLIFIER

(75) Inventors: Michimasa Yamaguchi, Kanagawa (JP);
Kenichi Kawakami, Kanagawa (JP)

(73) Assignee: Renesas Electronics Corporation,
Kawasaki-shi, Kanagawa (JP)

( * ) Notice: Subject to any disclaimer, the term of this patent is extended or adjusted under 35 U.S.C. 154(b) by 0 days.

(21) Appl. No.: 12/801,304

(22) Filed: Jun. 2, 2010

(65) Prior Publication Data
US 2011/0025416 A1 Feb. 3, 2011

(30) Foreign Application Priority Data
Jul. 31, 2009 (JP) .................................. 2009-178960

(51) Int. Cl.
*H03F 3/45* (2006.01)
(52) U.S. Cl. ...................................................... 330/253
(58) Field of Classification Search ........... 330/252–261
See application file for complete search history.

(56) References Cited

U.S. PATENT DOCUMENTS
6,980,055 B2 * 12/2005 Gharpurey .................... 330/257

FOREIGN PATENT DOCUMENTS
JP 3-85817 A 4/1991

* cited by examiner

*Primary Examiner* — Hieu Nguyen
(74) *Attorney, Agent, or Firm* — McGinn IP Law Group, PLLC

(57) ABSTRACT

A differential amplifier including: 1st transistor that is connected between 1st power-supply terminal and 1st output terminal, and has a control terminal receiving one of the differential input signals; 2nd transistor that is connected between 2nd power-supply terminal and 1st output terminal, and has a control terminal receiving the other of the differential input signals; 1st switch that is connected between 1st power-supply terminal and 1st transistor; 3rd transistor that is connected between 2nd power-supply terminal and 2nd output terminal, and has a control terminal receiving one of the differential input signals; 4th transistor that is connected between 1st power-supply terminal and 2nd output terminal, and has a control terminal receiving the other of the differential input signals; 2nd switch that is connected between 2nd power-supply terminal and 3rd transistor. Drive state of 1st and 2nd switches are controlled by a control signal.

12 Claims, 17 Drawing Sheets

DIFFERENTIAL AMPLIFIER

INCORPORATION BY REFERENCE

This application is based upon and claims the benefit of priority from Japanese patent application No. 2009-178960, filed on Jul. 31, 2009, the disclosure of which is incorporated herein in its entirety by reference.

BACKGROUND

1. Field of the Invention

The present invention relates to a differential amplifier.

2. Description of Related Art

Presently, a differential amplifier is used for a differential input buffer in a receiving circuit of a high-speed interface such as USB 2.0. Japanese Unexamined Patent Application Publication No. 3-85817 discloses a technique of such a differential amplifier as prior art. Meanwhile, in a semiconductor device equipped with the differential amplifier, a power down technique that stops an operating current when the differential amplifier stops operating is generally used for reducing power consumption. FIGS. 12 and 13 show configurations of differential amplifiers 1 and 2 according to related art. The differential amplifiers 1 and 2 are added a switching circuit for reducing power consumption in the configuration the circuit disclosed in Japanese Unexamined Patent Application Publication No. 3-85817. Note that the differential amplifiers 1 and 2 are composed of MOS transistors of opposite conductivity types.

As shown in FIG. 12, the differential amplifier 1 includes PMOS transistors MP1 to MP4 and a power-down switch circuit PDSW1.

The source of the PMOS transistor MP3 is connected to a power-supply voltage terminal VDD, the drain of the PMOS transistor MP3 is connected to an output terminal OT, and the gate of the PMOS transistor MP3 is connected to an input terminal IB. The source of the PMOS transistor MP4 is connected to the power-supply voltage terminal VDD, the drain of the PMOS transistor MP4 is connected to an output terminal OB, and the gate of the PMOS transistor MP4 is connected to an input terminal IT. The source of the PMOS transistor MP1 is connected to the output terminal OT, the drain of the PMOS transistor MP1 is connected to a node N1, and the gate of the PMOS transistor MP1 is connected to the input terminal IT. The source of the PMOS transistor MP2 is connected to the output terminal OB, the drain of the PMOS transistor MP2 is connected to a node N2, and the gate of the PMOS transistor MP2 is connected to the input terminal IB.

The power-down switch circuit PDSW1 includes NMOS transistors MN11 and MN12. The drain of the NMOS transistor MN11 is connected to the node N1, and the source of the NMOS transistor MN11 is connected to a ground voltage terminal GND. The drain of the NMOS transistor MN12 is connected to the node N2, and the source of the NMOS transistor MN12 is connected to the ground voltage terminal GND. A power down signal PDB is input to the gates of the NMOS transistors MN11 and MN12. When the power down signal PDB is high level, the differential amplifier 1 is in a normal operation state. Meanwhile, when the power down signal PDB is low level, the differential amplifier 1 is in a power down state (stand-by state).

As shown in FIG. 13, the differential amplifier 2 includes NMOS transistors MN1 to MN4 and a power-down switch circuit PDSW2. The source of the NMOS transistor MN1 is connected to the ground voltage terminal GND, the drain of the NMOS transistor MN1 is connected to the output terminal OT, and the gate of the NMOS transistor MN1 is connected to the input terminal IT. The source of the NMOS transistor MN2 is connected to the ground voltage terminal GND, the drain of the NMOS transistor MN2 is connected to the output terminal OB, and the gate of the NMOS transistor MN2 is connected to the input terminal IB. The source of the NMOS transistor MN3 is connected to the output terminal OT, the drain of the NMOS transistor MN3 is connected to a node N3, and the gate of the NMOS transistor MN3 is connected to the input terminal IB. The source of the NMOS transistor MN4 is connected to the output terminal OB, the drain of the NMOS transistor MN4 is connected to a node N4, and the gate of the NMOS transistor MN4 is connected to the input terminal IT.

The power-down switch circuit PDSW2 includes PMOS transistors MP11 and MP12. The drain of the PMOS transistor MP11 is connected to the node N3, and the source of the PMOS transistor MP11 is connected to the power-supply voltage terminal VDD. The drain of the PMOS transistor MP12 is connected to the node N4, and the source of the PMOS transistor MP12 is connected to the power-supply voltage terminal VDD. A power down signal PDB is input to the gates of the PMOS transistors MP11 and MP12. When the power down signal PDB is low level, the differential amplifier 2 is in the normal operation state. Meanwhile, when the power down signal PDB is high level, the differential amplifier 2 is in the power down state (stand-by state).

For convenience of description, reference symbols "VDD" and "GND" represent a power-supply voltage and a ground voltage, respectively, and also represent terminal names. Further, for convenience of description, reference symbols "IT" and "IB" represent terminal names as well as names of signals input to the terminals. Furthermore, for convenience of description, reference symbols "OT" and "OB" represent terminal names as well as names of signals output from the terminals.

FIG. 14 shows a timing diagram illustrating operation of the differential amplifier 1. Referring to FIG. 14, before a time t1, the differential amplifier 1 is in the power down state because the power down signal PDB is low level. At the time t1, the power down signal PDB is high level. Thus, the differential amplifier 1 starts normal operation, and outputs the differential output signals OT and OB in response to the differential input signals IT and IB. At a time t2, the power down signal PDB becomes low level again. Accordingly, the differential amplifier 1 becomes the power down state again.

Note that the polarity of each signal in FIG. 14 is opposite to that shown in a timing diagram illustrating operation of the differential amplifier 2. Except for this point, the basic operation of the differential amplifier 2 is similar to that of the differential amplifier 1. Therefore, explanation of the operation thereof is omitted here.

SUMMARY

The present inventors have found that the differential amplifier 1 and 2 have a problem as described below. This problem is explained hereinafter with reference to the drawings, by taking the differential amplifier 1 as an example. FIGS. 15 and 16 show exemplary schematic diagrams to explain the problem of the differential amplifier 1. Each of the PMOS transistors MP1 to MP4 of the differential amplifier 1 has a parasitic capacitance between gate and drain and a parasitic capacitance between gate and source. FIG. 15 shows parasitic capacitances C1 to C4 each of which is formed between the gate and drain of each of the PMOS transistors MP1 to MP4. Herein, the parasitic capacitance between the gate and source of each of the PMOS transistors MP1 to MP4 shown in FIG. 15 is omitted in order to simplify the drawings.

First, before the time t1 of FIG. 14, the differential amplifier 1 is in the power down state. The NMOS transistors MN11 and MN12 turn off because the power down signal PDB is low level. Thus, no current flows through a first current path that is composed of the PMOS transistors MP3, and MP1 and the NMOS transistor MN11. As a result, the potentials of the node N1 and the output terminal OT are substantially the same as the power-supply voltage VDD. Similarly, no current flows through a second current path that is composed of the PMOS transistors MP4, and MP2 and the NMOS transistor MN12. As a result, the potentials of the node N2 and the output terminal OB are substantially the same as the power-supply voltage VDD.

At the time t1, the differential amplifier 1 is in the normal operation state. Because the power down signal PDB is high level, the NMOS transistors MN11 and MN12 are turned on. Thus, an operating point of each of the first and second current paths is determined according to the differential input signals IT and IB. As a result, the drain voltage of the PMOS transistors MP1 to MP4 decreases to a predetermined voltage from the power-supply voltage VDD. That is, each potential on the drain side of each parasitic capacitance between the drain and gate of the PMOS transistors MP1 to MP4 decreases.

Thus, as shown FIG. 15, a charging current from the input terminal IT to the parasitic capacitances C1 and C4 is generated. Therefore, the gating current of the PMOS transistors MP1 and MP4 increases. As a result, a current flows in from the input terminal IT, and the potential of the input terminal IT decreases. This potential of the input terminal IT returns to the former potential when the parasitic capacitances C1 and C4 complete the charge according to the current of the mirror. A similar phenomenon occurs on the input terminal IB side.

Next, at the time t2, the NMOS transistors MN11 and MN12 are turned off, because the power down signal PDB is low level. Thus, no current flows through the first and second current paths, and the potential of each of the nodes N1 and N2 and the output terminals OT and OB changes to a potential substantially equal to the power-supply voltage VDD again. At a result, each potential on the drain side of each parasitic capacitance between the drain and gate of each the PMOS transistors MP1 to MP4 increases.

Thus, as shown in FIG. 16, a discharging current flows out of the gate side of each parasitic capacitance charged. Therefore, the gating current of the PMOS transistors MP1 and MP4 increases. As a result, the current at the input terminal IT increases and the potential of the input terminal IT rises. This potential of the input terminal IT returns to the former potential when the parasitic capacitances C1 and C4 complete the discharge according to the current of the mirror. A similar phenomenon occurs on the input terminal IB side.

FIG. 17 shows a timing diagram illustrating current and voltage waveforms of the PMOS transistors MP1 to MP4 and the input terminals IT and IB described above. Reference symbols representing time in FIG. 17 are identical to those of FIG. 14. As shown in FIG. 17, at the times t1 and t2, the above-mentioned voltage change occurs with a change of the signal level of the input terminals IT and IB. This voltage change causes noise in a signal input to other circuits connected with the input terminals IT and IB of the differential amplifier 1. There is a possibility that the input signal including this noise causes a malfunction of the other circuits. This problem arises also in the differential amplifier 2, but the explanation therefore is omitted because it is basically the same as the differential amplifier 1.

A first exemplary aspect of the prevent invention, is a differential amplifier including: a first current path that is connected between a first power-supply terminal and a second power-supply terminal, and outputs one of differential output signals, a second current path that is connected between the first power-supply terminal and the second power-supply terminal, and output the other of differential output signals in which the first current path includes: a first transistor that is connected between the first power-supply terminal and a first output terminal that outputs one of the differential output signals, and has a control terminal receiving one of the differential input signals; a second transistor that is connected between the second power-supply terminal and the first output terminal, and has a control terminal receiving the other of the differential input signals and a first switch circuit that is connected between the first power-supply terminal and the first transistor, the second current path includes: a third transistor that is connected between the second power-supply terminal and a second output terminal that outputs the other of the differential output signals, and has a control terminal receiving one of the differential input signals; a fourth transistor that is connected between the first power-supply terminal and the second output terminal, and has a control terminal receiving the other of the differential input signals and a second switch circuit that is connected between the second power-supply terminal and the third transistor, and a drive state of each of the first and second switch circuits is controlled by a control signal.

The differential amplifier of according to the first exemplary aspect of the invention can counterbalance currents generated through parasitic capacitances of the first and third transistors when the first and second switches are changed to their conductive state or non-conductive state. Similarly, the differential amplifier can counterbalance currents generated through parasitic capacitances of the second and fourth transistors. The change of the potential generated in the one input terminal of the differential input signal supplied to the control terminals of the first and third transistors and the other input terminal of the differential input signal supplied to the control terminals of the second and fourth transistors can be reduced.

The differential amplifier according to the first exemplary aspect of the present invention is capable of reducing the noise generated in the input terminal, and preventing a malfunction of other circuits connected with the input terminal.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
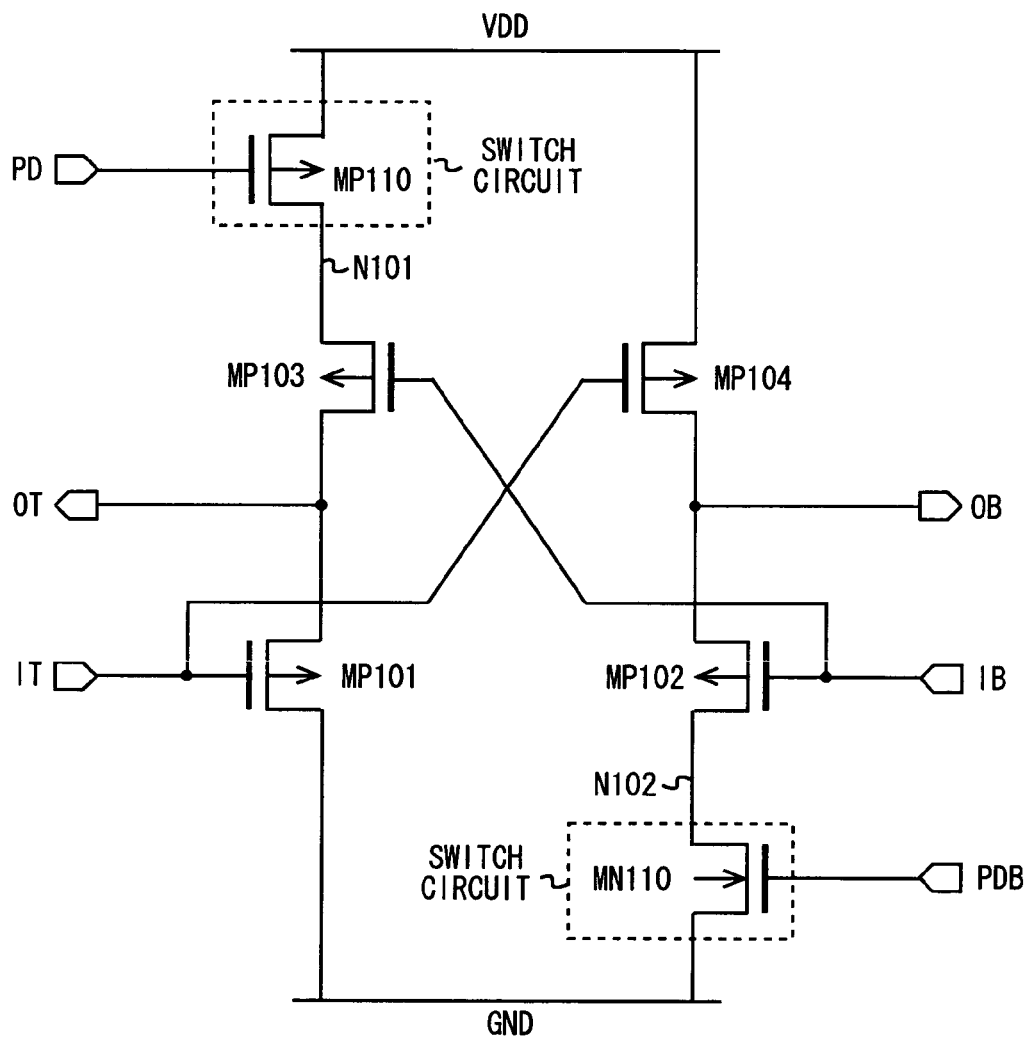
FIG. 1 shows a configuration of a differential amplifier in accordance with a first exemplary embodiment of the present invention.

A first exemplary embodiment of the present invention will be described in detail below with reference to the accompanying drawings. FIG. 1 shows a configuration of a differential amplifier 100 in accordance with this exemplary embodiment. As shown in FIG. 1, the differential amplifier 100 includes PMOS transistors MP101 to MP104, and MP110 and a NMOS transistor MN110.

The source of the PMOS transistor MP110 is connected to a power-supply voltage terminal VDD, and the drain of the PMOS transistor MP110 is connected to a node N101. A power down signal PD is input to the gate of the PMOS transistor MP110. The source of the PMOS transistor MP103 is connected to the node N101, the drain of the PMOS transistor MP103 is connected to an output terminal OT, and the gate of the PMOS transistor MP103 is connected to an input terminal IB. The source of the PMOS transistor MP101 is connected to the output terminal OT, the drain of the PMOS transistor MP101 is connected to a ground voltage terminal GND, and the gate of the PMOS transistor MP101 is connected to an input terminal IT. These PMOS transistors MP110, MP103, and MP101 constitute a first current path.

The source of the PMOS transistor MP104 is connected to the power-supply voltage terminal VDD, the drain of the PMOS transistor MP104 is connected to an output terminal OB, and the gate of the PMOS transistor MP104 is connected to the input terminal IT. The source of the PMOS transistor MP102 is connected to the output terminal OB, the drain of the PMOS transistor MP102 is connected to a node N102, and the gate of the PMOS transistor MP102 is connected to the input terminal IB. The drain of the NMOS transistor MN110 is connected to the node N102, and the source of the NMOS transistor MN110 is connected to the ground voltage terminal GND. A power down signal PDB is input to the gate of the NMOS transistor MN110. The power down signal PDB is a reversed phase signal of the power down signal PD. These PMOS transistors MP104, and MP102 and the NMOS transistor MN110 constitute a second current path.

The PMOS transistor MP110 and NMOS transistor MN110 can be regarded as switch circuits that control whether to cause a driving current to flow through the first and second current paths in response to the power down signals PD and PDB, respectively. That is, the driving state of the differential amplifier 100 can be controlled by the power down signals PD and PDB. The power down signals PD and PDB have opposite phases to each other, and thus can be easily generated by inverting the phase of one of the signals using as invertor circuit or the like. Therefore, the power down signals PD and PDB can be regarded as one control signal.

Figure 2:
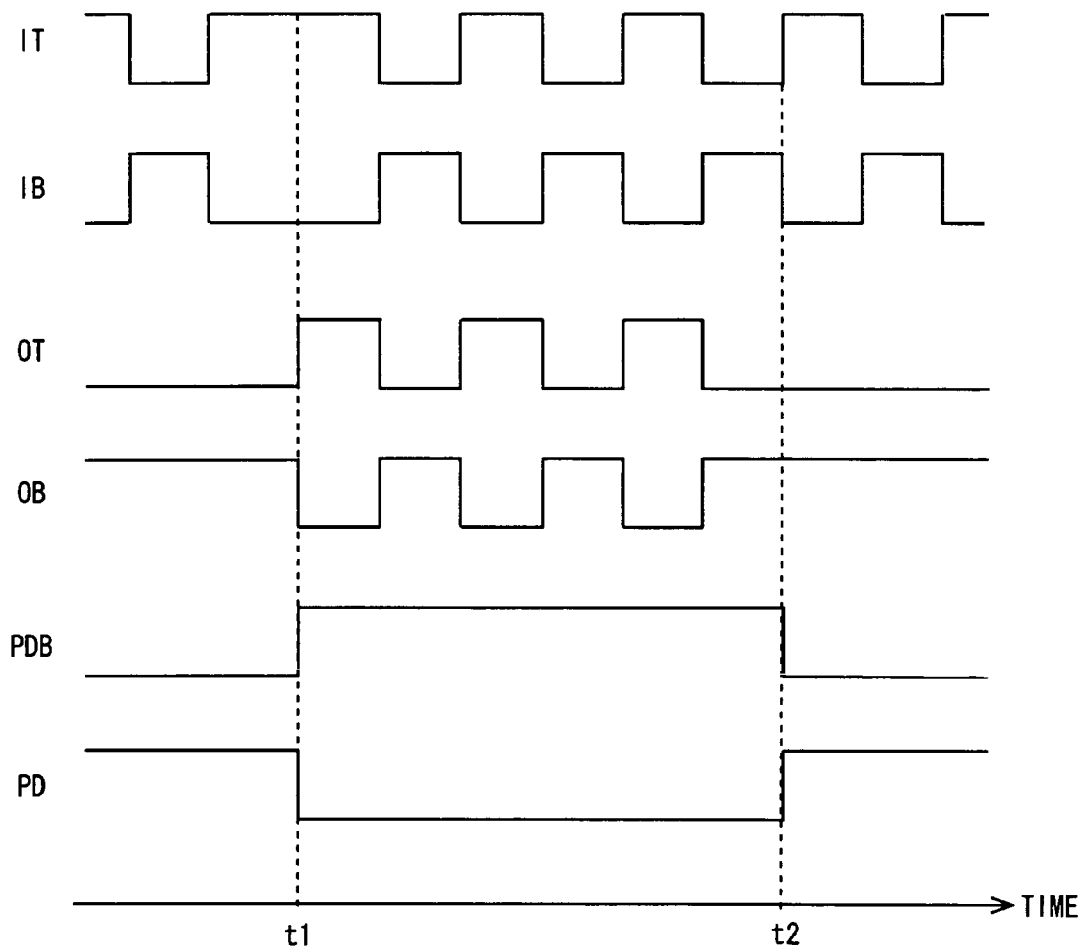
FIG. 2 is a timing diagram showing operation of the differential amplifier in accordance with the first exemplary embodiment of the present invention.

FIG. 2 shows a timing diagram illustrating operation of the differential amplifier 100. Referring to FIG. 2, before a time t1, the power down signal PDB is low level and the power down signal PD is high level. Thus, the PMOS transistor MP110 and the NMOS transistor MN110 turn off. As a result, no driving current flows through the first and second current paths, and the differential amplifier 100 is in a power down state (stand-by state).

The potential of the node N101 and the output terminal OT is substantially the same as the ground voltage GND, because no current flows through the first current path. Further, the potentials of the node N102 and the output terminal OB are substantially the same as the power-supply voltage VDD, because no current flows through the second current path.

Next, at the time t1, the power down signal PDB is high level and the power down signal PD is low level. Thus, the PMOS transistor MP110 and the NMOS transistor MN110 enter an on state from an off state. As a result, a driving current flows through the first and second current paths, and the differential amplifier 100 is in a normal operation state. The differential output signals OT and OB are output from the differential output terminals OT and OB in response to the differential input signals IT and IB that are input to the differential input terminals IT and IB. Thus, each operating point of each of the first and second current paths is determined according to the differential input signals IT and IB. The source voltage of the PMOS transistors MP101 and MP103 rises from a ground voltage GND to a predetermined voltage in the first current path. Further, the drain voltage of the PMOS transistors MP101 and MP103 decreases from the power-supply voltage to a predetermined voltage in the second current path.

Next, at a time t2, the power down signal PDB is low level and the power down signal PD is high level. Thus, the PMOS transistor MP110 and the NMOS transistor MN110 enter the off state from the on state. Therefore, no driving current flows through the first and second current paths, and the differential amplifier 100 enter the power down state (stand-by state) again.

As a result, no current flows through the first current path, and the potentials of the node N101 and the output terminal OT decrease to the ground voltage GND. Further, no current flows through the second current path, and the potentials of the node N102 and the output terminal OB rise to a power-supply voltage VDD. Note that, in the following description, a time period during which the operation state changes from the power down state to the normal operation state or from the normal operation state to the power down state is referred to as "during operation state change".

Figure 3:
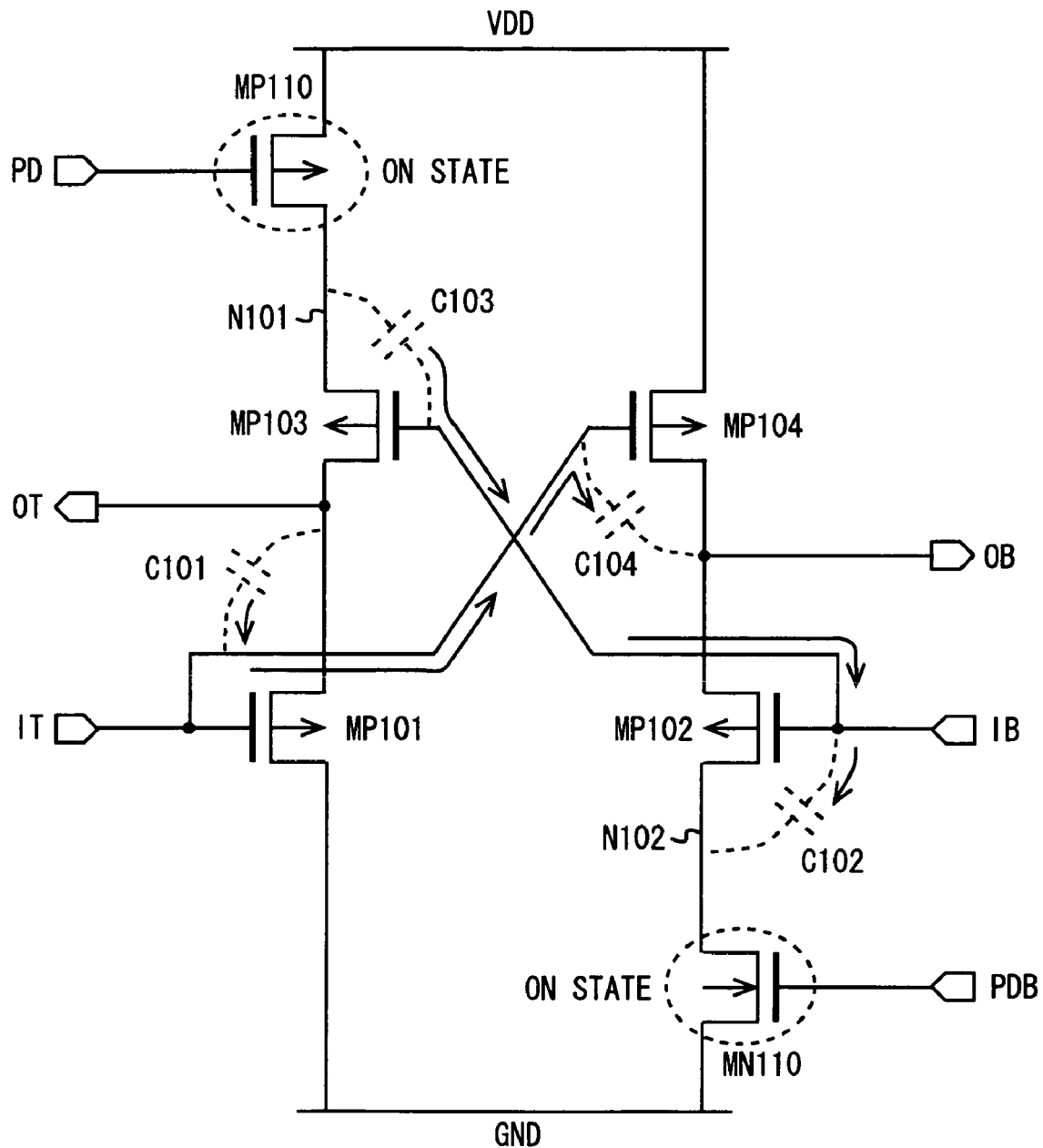
FIG. 3 is a schematic diagram for explaining advantageous effect of the differential amplifier in accordance with the first exemplary embodiment of the present invention.
Figure 4:
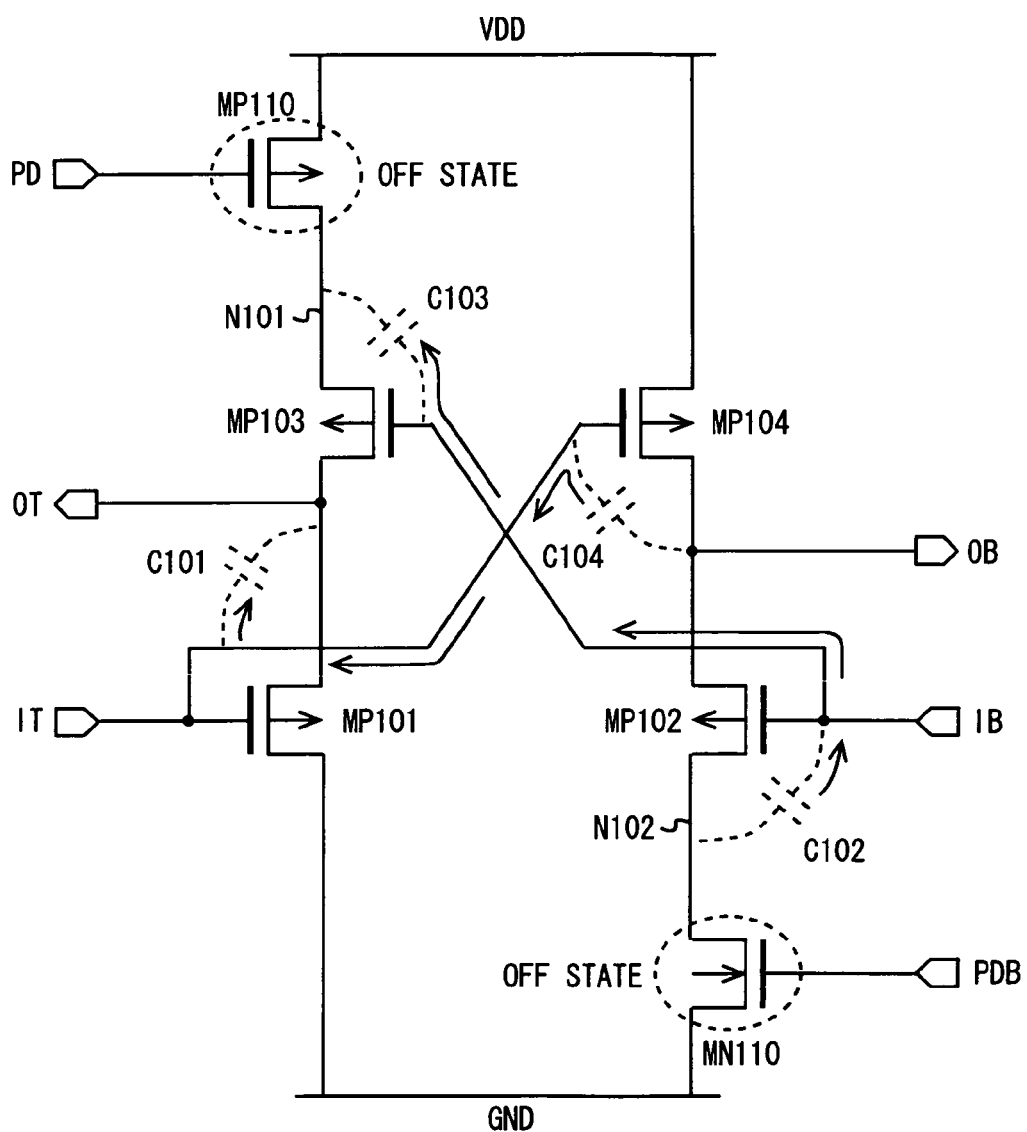
FIG. 4 is a schematic diagram for explaining advantageous effect of the differential amplifier in accordance with the first exemplary embodiment of the present invention.
Figure 5:
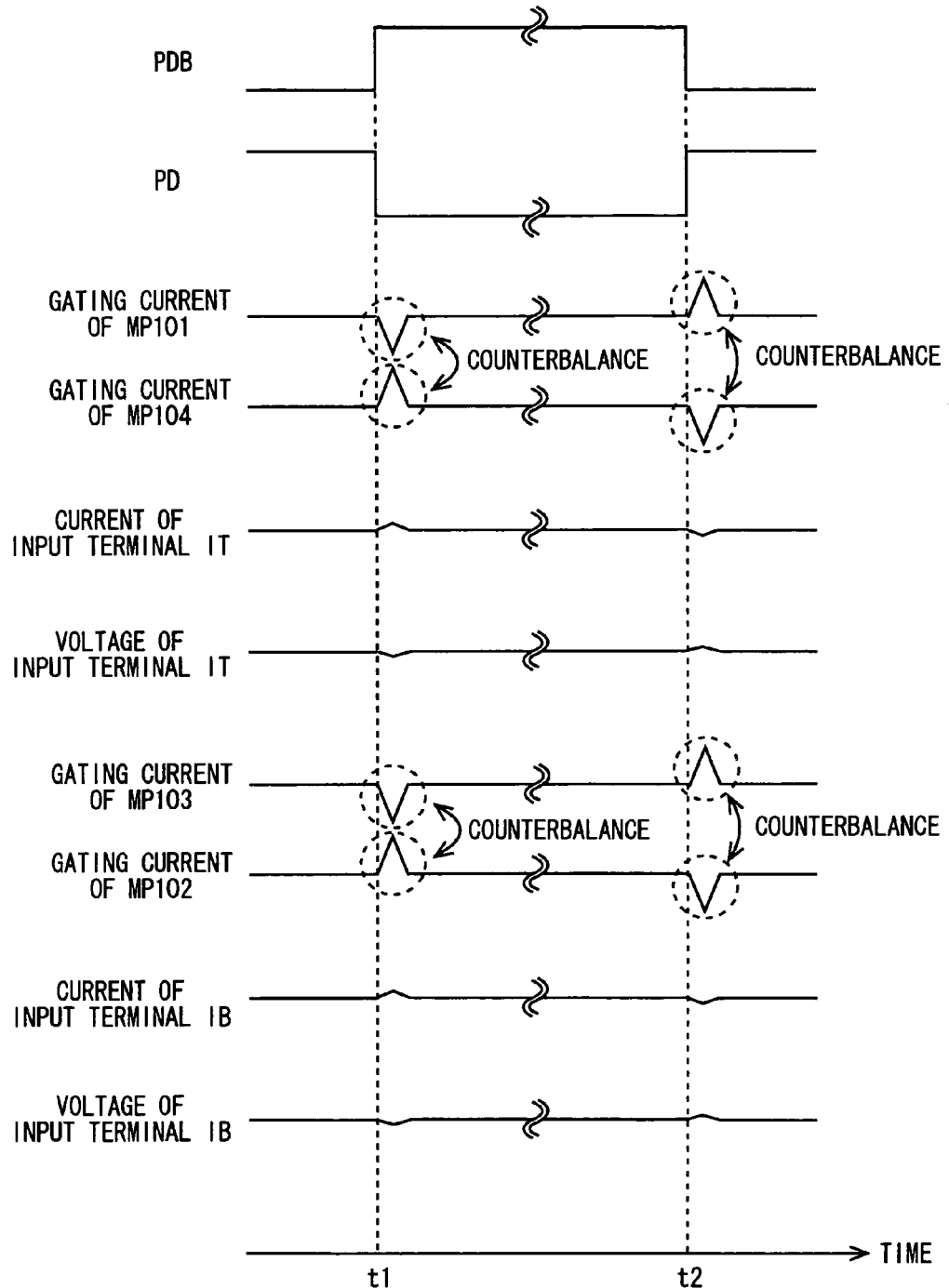
FIG. 5 is a timing diagram for explaining advantageous effect of the differential amplifier in accordance with the first exemplary embodiment of the present invention.

In this case, as with the differential amplifier 1 of related art, each PMOS transistor has parasitic capacitances between the gate and the drain and between the gate and the source. In the differential amplifier 1, during operation state change, noise due to the electrical charge and discharge operation of the parasitic capacitances is generated in the input terminals IT and IB. In differential amplifier 100 of the first exemplary embodiment, however, the noise generated in the input terminals IT and IB during operation state change can be reduced. This noise reduction mechanism provided by the differential amplifier 100 will be described below referring to the drawings. FIGS. 3 and 4 show schematic diagrams illustrating the charge and discharge current to the parasitic capacitances generated during operation state change of the differential amplifier 100. To simplify the illustration, only one of the parasitic capacitance between the gate and the drain and the parasitic capacitance between the gate and the source is shown in FIGS. 3 and 4. Actually, it is noted that the electrical charge and discharge are caused by both the parasitic capacitance between the gate and the drain and the parasitic capacitance between the gate and the source. Further, FIG. 5 shows a timing diagram illustrating current and voltage waveforms of the PMOS transistors MP101 to MP104 and the input terminals IT and IB. Reference symbols representing time in FIG. 5 are identical to those of FIG. 2.

As shown in FIG. 3, the PMOS transistors MP101 to MP104 of the differential amplifier 100 have parasitic capacitances C101 to C104 respectively. The parasitic capacitances C101 and C103 are the parasitic capacitances between the gate and source of the PMOS transistors MP101 and MP103, respectively. Further, the parasitic capacitances C102 and C104 are the parasitic capacitances between the gate and drain of the PMOS transistors MP102 and MP104, respectively.

FIG. 3 is a schematic diagram that shows the charge and discharge current to each parasitic capacitance when the PMOS transistor MP110 and the NMOS transistor MN110 enter the on state from the off state at the time t1. In this case, as described above, the potential of the output terminal OT rises from the ground voltage GND and the potential of the output terminal OB decreases from the power-supply voltage VDD. As shown in FIG. 3, the parasitic capacitances C101 and C103 allow a current to flow out of the gate, and the parasitic capacitances C102 and C104 allow a current to flow in from the gate. Therefore, as shown at the time t1 of FIG. 5, the gating current of the PMOS transistors MP101 and MP103 when viewed from the input terminal side decreases, and the gating current of PMOS transistors MP102 and MP104 when viewed from the input terminal side increases.

When the parasitic capacitances C101 and C104 are paid attention, a current flows out of the parasitic capacitance C101, and at the same time, a current flows into parasitic capacitance C104. Similarly, when the parasitic capacitances C102 and C103 are paid attention, a current flows out of the parasitic capacitance C103, and at the same time, a current flows into parasitic capacitance C102. The inflow and outflow of the gating current of the PMOS transistors MP101 and MP104 whose gates are connected with the input terminal IT occur at the same time, and the currents are counterbalanced. Further, the inflow and outflow of the gating current of the PMOS transistors MP102 and MP103 whose gates are connected with the input terminal IB occur at the same time, and the currents are counterbalanced. Thus, as shown in FIG. 5, increase and decrease of the current at the input terminals IT and IB is suppressed even if the operation state changes from the power down state to the normal operation state at the time t1. As a result, the change of the potential in the input terminals IT and IB is decreased, and the noise generated in the input terminals IT and IB can be reduced.

FIG. 4 is a schematic diagram that shows the charge and discharge current to each parasitic capacitance when the PMOS transistor MP110 and the NMOS transistor MN110 enter the off state from the on state at the time t2. In this case, as described above, the potential of the output terminals OT and the node N101 decrease to the ground voltage GND and the potentials of the output terminal OB and the node N102 rise to the power-supply voltage VDD. Thus, as shown in FIG. 4, the parasitic capacitances C101 and C103 allow a current to flow in from the gate, and the parasitic capacitances C102 and C104 allow a current to flow out of the gate. Therefore, as shown at the time t2 of FIG. 5, the gating current of the PMOS transistors MP101 and MP103 when viewed from the input terminal side increases, and the gating current of the PMOS transistors MP102 and MP104 when viewed from the input terminal side decreases.

When the parasitic capacitances C101 and C104 are paid attention, a current flows into the parasitic capacitance C101, and at the same time, a current flows out of the parasitic capacitance C104. Similarly, when the parasitic capacitances C102 and C103 are paid attention, a current flows out of the parasitic capacitance C102, and at the same time, a current flows into the parasitic capacitance C103. The inflow and outflow of the gating current of the PMOS transistors MP101 and MP104 whose gates are connected with the input terminal IT occur at the same time, and the current are counterbalanced. Further, the inflow and outflow of the gating current of the PMOS transistors MP102 and MP103 whose gates are connected with the input terminal IB occur at the same time, and the current are counterbalanced. Thus, as shown in FIG. 5, increase and decrease of the current at the input terminals IT and IB is suppressed even if the operation state changes from the normal operation state to the power down state at the time t2. As a result, the change in potential of the input terminals IT and IB is decreased, and the noise generated in the input terminals IT and IB can be reduced.

Thus, the differential amplifier 100 of the first exemplary embodiment makes it possible to reduce the noise that is generated in the input terminals IT and IB of the differential amplifier 1 of the related art during operation state change. As a result, the noise is not transmitted to a signal input to other circuits connected with the input terminal of the differential amplifier 100 according to the first exemplary embodiment. The differential amplifier 100 according to the first exemplary embodiment can prevent other circuits from causing a malfunction.

Figure 6:
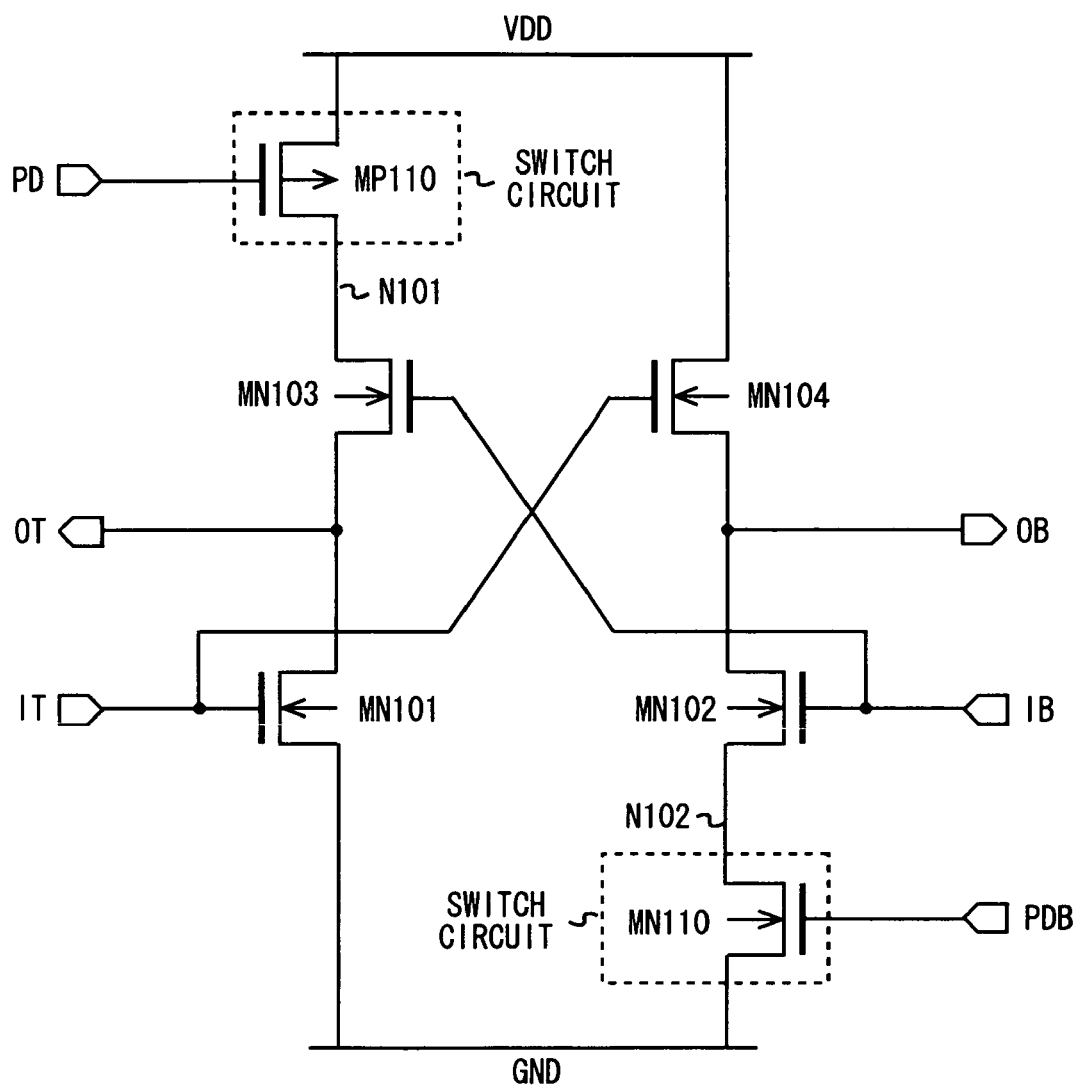
FIG. 6 shows another configuration of a differential amplifier in accordance with the first exemplary embodiment of the present invention.

Further, FIG. 6 shows a configuration of a differential amplifier 101 in which the conductivity type of the MOS transistors of the differential amplifier 100 of FIG. 1 is reversed. As shown in FIG. 6, the differential amplifier 101 includes NMOS transistors MN101 to MN104, and MN110 and the PMOS transistor MP110.

The source of the PMOS transistor MP110 is connected to the power-supply voltage terminal VDD, and the drain of the PMOS transistor MP110 is connected to a node N101. The power down signal PD is input to the gate of the PMOS transistor MP110. The drain of the NMOS transistor MN103 is connected to the node N101, the source of the NMOS transistor MN103 is connected to an output terminal OT, and the gate of the NMOS transistor MN103 is connected to an input terminal IB. The drain of the NMOS transistor MN101 is connected to the output terminal OT, the source of the NMOS transistor MN101 is connected to a ground voltage terminal GND, and the gate of the NMOS transistor MN101 is connected to an input terminal IT. The PMOS transistor MP110 and the NMOS transistors MN103 and MN101 constitute the first current path.

The drain of the NMOS transistor MN104 is connected to the power-supply voltage terminal VDD, the source of the NMOS transistor MN104 is connected to the output terminal OB, and the gate of the NMOS transistor MN104 is connected to the input terminal IT. The drain of the NMOS transistor MN102 is connected to the output terminal OB, the source of the NMOS transistor MN102 is connected to the node N102, and the gate of the NMOS transistor MN102 is connected to the input terminal IB. The drain of the NMOS transistor MN110 is connected to the node N102, and the source of the NMOS transistor MN110 is connected to the ground voltage terminal GND. The power down signal PDB is input to the gate of the NMOS transistor MN110. The power down signal PDB is a reversed phase signal of the power down signal PD. The NMOS transistors MN104, MN102 and MN110 constitute the second current path.

Note that reference symbols of FIG. 6 identical to those of FIG. 1 denote identical or similar elements. The differential amplifier 101 has a configuration in which the PMOS transistors MP101 to MP104 of the differential amplifier 100 are replaced with the NMOS transistors MN101 to MN104, respectively. Thus, the principle of suppressing the increase or decrease of the current at the input terminals IT and IB generated during operation state change, is similar to that of the differential amplifier 100. Therefore, the detailed description of the principle and the like of the differential amplifier 101 is omitted.

Thus, in the differential amplifier 101, it is possible to decrease a change in the potential of the input terminals IT and IB even if the conductivity type of the MOS transistors, which are driven by the input signals IT and IB, is reversed that of the differential amplifier 100. Further, the noise generated in the input terminals IT and IB can be reduced. As a result, the noise is not transmitted to a signal input to other circuits connected with the input terminal of the differential amplifier 101. The differential amplifier 101 can prevent other circuits from causing a malfunction, as with the differential amplifier 100.

Second Exemplary Embodiment

Figure 7:
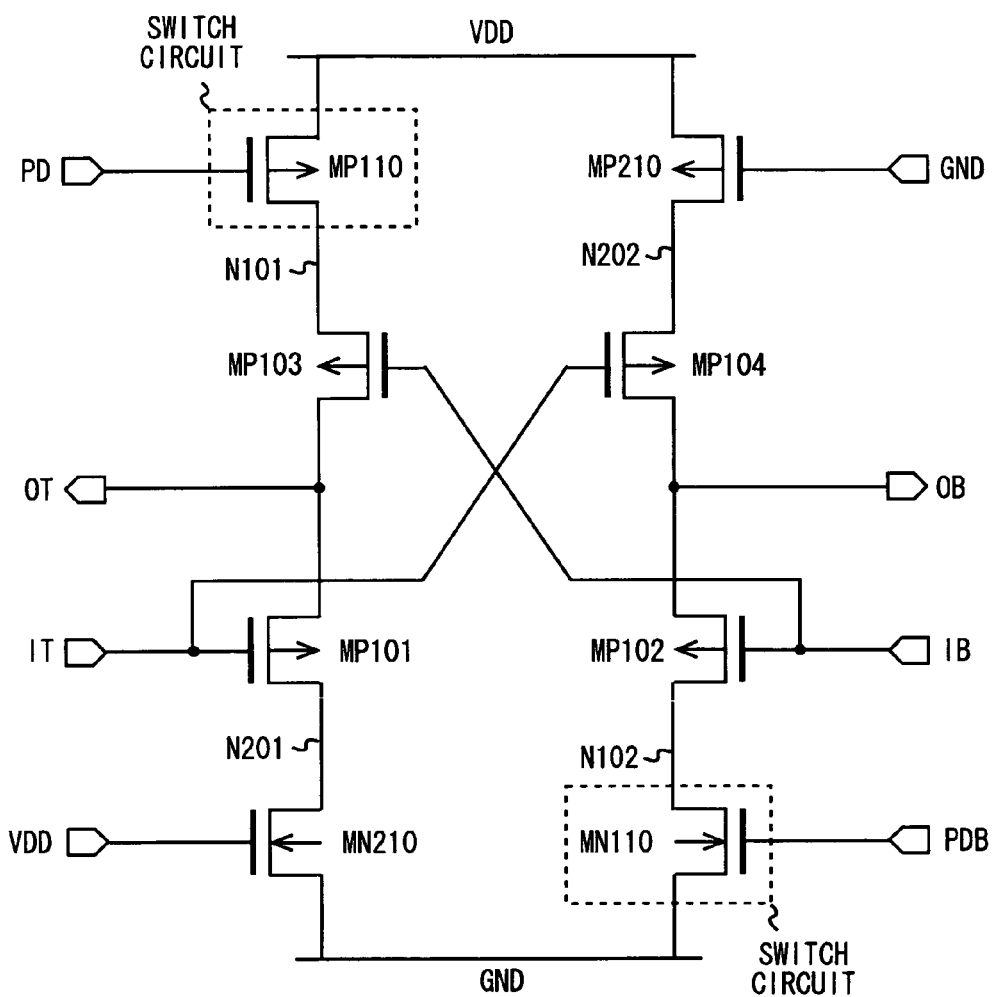
FIG. 7 shows a configuration of a differential amplifier in accordance with a second exemplary embodiment of the present invention.

A second exemplary embodiment of the present invention will be described in detail below with reference to the drawings. FIG. 7 shows an exemplary configuration of a differential amplifier 200 in accordance with the second exemplary embodiment. As shown in FIG. 7, the differential amplifier 200 includes PMOS transistors MP101 to MP104, MP110, and MP210, and NMOS transistors MN110 and MN210.

The source of the PMOS transistor MP110 is connected to a power-supply voltage terminal VDD, and the drain of the PMOS transistor MP110 is connected to a node N101. A power down signal PD is input to the gate of the PMOS transistor MP110. The source of the PMOS transistor MP103 is connected to the node N101, the drain of the PMOS transistor MP103 is connected to an output terminal OT, and the gate of the PMOS transistor MP103 is connected to an input terminal IB. The source of the PMOS transistor MP101 is connected to the output terminal OT, the drain of the PMOS transistor MP101 is connected to a node N201, and the gate of the PMOS transistor MP101 is connected to an input terminal IT. The drain of the NMOS transistor MN210 is connected to the node N201, and the source of the NMOS transistor MN210 is connected to a ground voltage terminal GND. A power-supply voltage VDD is input to the gate of the NMOS transistor MN210. The PMOS transistors MP110, MP103, and MP101 and NMOS transistor MN210 constitute a first current path.

The source of the PMOS transistor MP210 is connected to the power-supply voltage terminal VDD, and the drain of the PMOS transistor MP210 is connected to a node N202. A ground voltage GND is input to the gate of the PMOS transistor MP210. The source of the PMOS transistor MP104 is connected to the node N202, the drain of the PMOS transistor MP104 is connected to an output terminal OB, and the gate of the PMOS transistor MP104 is connected to the input terminal IT. The source of the PMOS transistor MP102 is connected to the output terminal OB, the drain of the PMOS transistor MP102 is connected to a node N102, and the gate of the PMOS transistor MP102 is connected to the input terminal IB. The drain of the NMOS transistor MN110 is connected to the node N102, and the source of the NMOS transistor MN110 is connected to the ground voltage terminal GND. A power down signal PDB is input to the gate of the NMOS transistor MN110. The power down signal PDB is a reversed phase signal of the power down signal PD. The PMOS transistors MP210, MP104, and MP102 and the NMOS transistor MN110 constitute a second current path.

Note that reference symbols of FIG. 7 identical to those of FIG. 1 denote identical or similar elements. The differential amplifier 200 differs from the differential amplifier 100 of the first exemplary embodiment in the point that the PMOS transistor MP210 is connected between the PMOS transistor MN104 and the power-supply voltage terminal VDD and the NMOS transistor MN210 is connected between the PMOS transistor MP101 and the ground voltage terminal GND.

The gate voltage of the PMOS transistor MP210 is clamped to the ground voltage GND. Further, the gate voltage of the NMOS transistor MN210 is clamped to the power-supply voltage VDD. Therefore, the PMOS transistor MP210 and NMOS transistor MN210 are always in the on state. As a result, the operation and the noise reduction mechanism for the input terminals IT and IB of the differential amplifier 200 are similar to those of the differential amplifier 100.

The PMOS transistors MP110 and MP210 are assumed to have the same transistor size or the like. The PMOS transistors MP103 and MP104 are assumed to have the same transistor size or the like. The PMOS transistors MP101 and MP102 are assumed to have the same transistor size or the like. The NMOS transistors MN110 and MN210 are assumed to have the same transistor size or the like. The current path 1 and the current path 2 can be symmetrically designed. Therefore, the current paths 1 and 2 can be designed to have the same electrical characteristics.

When the current path 1 and the current path 2 are asymmetric like in the differential amplifier 100 or 101, the transistor size respectively corresponding to the current paths 1 and 2 also become asymmetric, so as to obtain a desired voltage level with the output signals OT and OB. Therefore, it is difficult to design the current path 1 and the current path 2 to have the same electrical characteristics, and there is a problem that the design difficulty increases. This may have a significant influence on manufacturing variations.

As described above, because the current path 1 and the current path 2 are symmetric, the differential amplifier 200 enhances the easiness of the design and has a tolerance to manufacturing variations.

Figure 8:
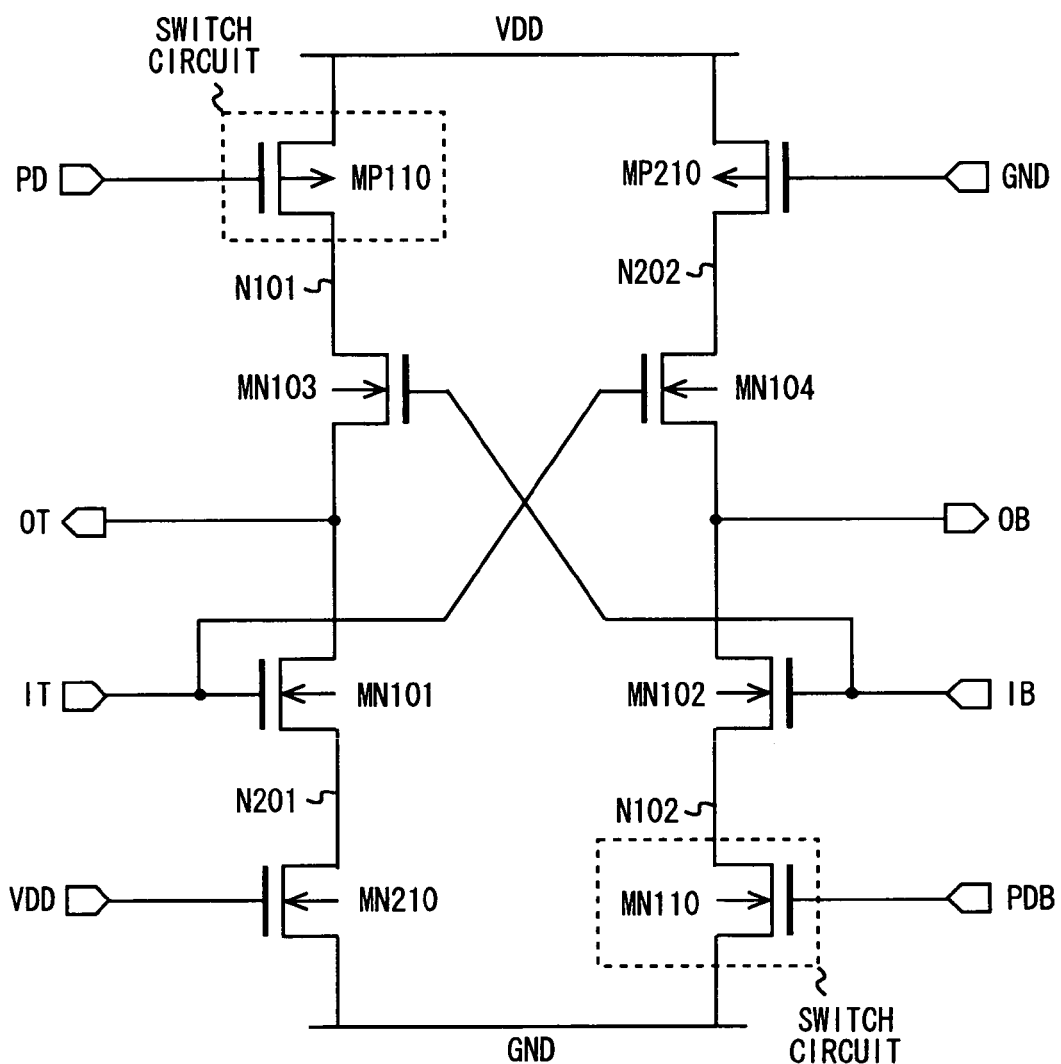
FIG. 8 shows another configuration of a differential amplifier in accordance with the second exemplary embodiment of the present invention.

Further, FIG. 8 shows a configuration of a differential amplifier 201 in which the conductivity type of the MOS transistors of the differential amplifier 200 of FIG. 7 is reversed. As shown in FIG. 8, the differential amplifier 201 includes NMOS transistors MN101 to MN104, MN110, and MN210, PMOS transistors MP110 and MP210.

The source of the PMOS transistor MP110 is connected to the power-supply voltage terminal VDD, and the drain of the PMOS transistor MP110 is connected to the node N101. The power down signal PD is input to the gate of the PMOS transistor MP110. The drain of the NMOS transistor MN103 is connected to the node N101, the source of the NMOS transistor MN103 is connected to the output terminal OT, and the gate of the NMOS transistor MN103 is connected to the input terminal IB. The drain of the NMOS transistor MN101 is connected to the output terminal OT, the source of the NMOS transistor MN101 is connected to the node N201, and the gate of the NMOS transistor MN101 is connected to the input terminal IT. The drain of the NMOS transistor MN210 is connected to the node N201, and the source of the NMOS transistor MN210 is connected to a ground voltage terminal GND. The power-supply voltage VDD is input to the gate of the NMOS transistor MN210. The PMOS transistor MP110, the NMOS transistors MN103, MN101, and MP210 constitute the first current path.

The source of the PMOS transistor MP210 is connected to the power-supply voltage terminal VDD, and the drain of the PMOS transistor MP210 is connected to the node N202. The ground voltage GND is input to the gate of the PMOS transistor MP210. The drain of the NMOS transistor MN104 is connected to the node N202, the source of the NMOS transistor MN104 is connected to the output terminal OB, and the gate of the NMOS transistor MN104 is connected to the input terminal IT. The drain of the NMOS transistor MN102 is connected to the output terminal OB, the source of the NMOS transistor MN102 is connected to the node N102, and the gate of the NMOS transistor MN102 is connected to the input terminal IB. The drain of the NMOS transistor MN110 is connected to the node N102, and the source of the NMOS transistor MN110 is connected to the ground voltage terminal GND. The power down signal PDB is input to the gate of the NMOS transistor MN110. The power down signal PDB is a reversed phase signal of the power down signal PD. The PMOS transistor MP210 and the NMOS transistors MN104, MN102, and MN110 constitute the second current path.

Note that reference symbols of FIG. 8 identical to those of FIGS. 1 and 6 denote identical or similar elements. The differential amplifier 201 has a configuration in which the conductivity type of the MOS transistors of differential amplifier 200 is reversed. The differential amplifier 201 differs from the differential amplifier 101 of the first exemplary embodiment in the point that the PMOS transistor MP210 is connected between the NMOS transistor MN104 and the power-supply voltage terminal VDD and the NMOS transistor MN210 is connected between the NMOS transistor MN101 and the ground voltage terminal GND.

The gate voltage of the PMOS transistor MP210 is clamped to the ground voltage GND. Further, the gate voltage of the NMOS transistor MN210 is clamped to the power-supply voltage VDD. Therefore, the PMOS transistor MP210 and NMOS transistor MN210 are always in the on state as with the differential amplifier 200. As a result, the operation and the noise reduction mechanism for the input terminals IT and IB of the differential amplifier 201 are similar to those of the differential amplifier 101.

The PMOS transistors MP110 and MP210 are assumed to have the same transistor size or the like. The NMOS transistors MN103 and MN104 are assumed to have the same transistor size or the like. The NMOS transistors MN101 and the MN102 are assumed to have the same transistor size or the like. The NMOS transistors MN110 and MN210 are assumed to have the same transistor size or the like. The current path 1 and the current path 2 can be symmetrically designed. Therefore, as with the differential amplifier 200, the current paths 1 and 2 can be designed to have the same electrical characteristics. Thus, the easiness of the design is enhanced in the differential amplifier 201. Further, the differential amplifier 201 has a tolerance to manufacturing variations.

Third Exemplary Embodiment

Figure 9:
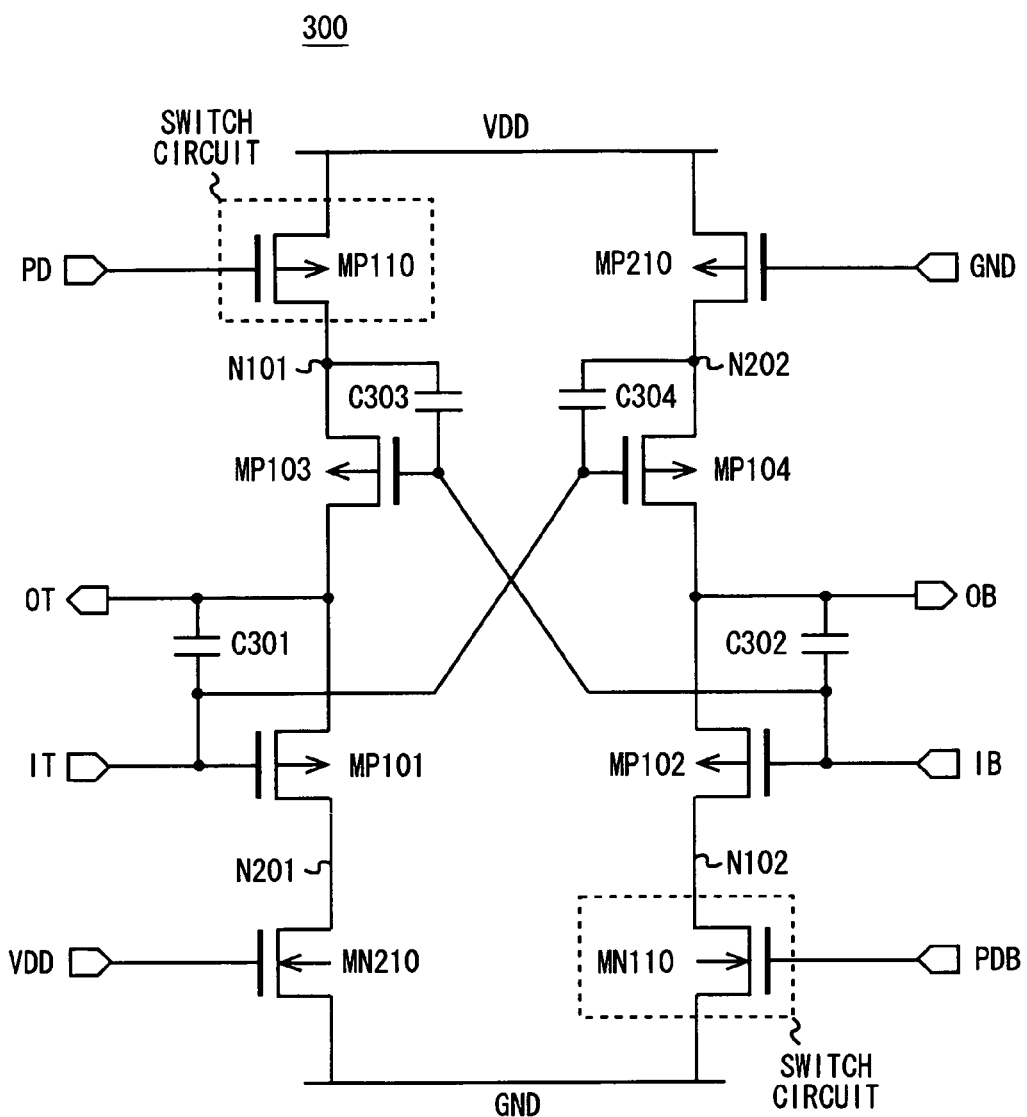
FIG. 9 shows a configuration of a differential amplifier in accordance with a third exemplary embodiment of the present invention.

A third exemplary embodiment of the present invention will be described in detail below with reference to the drawings. FIG. 9 shows an exemplary of a configuration of a differential amplifier 300 in accordance with the third exemplary embodiment. As shown in FIG. 9, the differential amplifier 300 includes PMOS transistors MP101 to MP104, MP110, and MP210, NMOS transistors MN110 and MN210, capacitors C301 to C304.

The source of the PMOS transistor MP110 is connected to a power-supply voltage terminal VDD, and the drain of the PMOS transistor MP110 is connected to a node N101. A power down signal PD is input to the gate of the PMOS transistor MP110. The source of the PMOS transistor MP103 is connected to the node 101, the drain of the PMOS transistor MP103 is connected to an output terminal OT, and the gate of the PMOS transistor MP103 is connected to an input terminal IB. The source of the PMOS transistor MP101 is connected to the output terminal OT, the drain of the PMOS transistor MP101 is connected to a node N201, and the gate of the PMOS transistor MP101 is connected to an input terminal IT. The drain of the NMOS transistor MN210 is connected to the node 201, and the source of the NMOS transistor MN210 is connected to a ground voltage terminal GND. A power-supply voltage VDD is input to the gate of the NMOS transistor MN210. The capacitor C301 is connected between the gate and the source of the PMOS transistor MP101. The capacitor C303 is connected between the gate and the source of the PMOS transistor MP103. The PMOS transistors MP110, MP103, and MP101 and the NMOS transistor MN210 constitute a first current path.

The source of the PMOS transistor MP210 is connected to the power-supply voltage terminal VDD, the drain of the PMOS transistor MP210 is connected to a node N202. The ground voltage GND is input to the gate of the PMOS transistor MP210. The source of the PMOS transistor MP104 is connected to the node N202, the drain of the PMOS transistor MP104 is connected to an output terminal OB, and the gate of the PMOS transistor MP104 is connected to the input terminal IT. The source of the PMOS transistor MP102 is connected to the output terminal OB, the drain of the PMOS transistor MP102 is connected to a node N102, and the gate of the PMOS transistor MP102 is connected to the input terminal IB. The drain of the NMOS transistor MN110 is connected to the node N102, and the source of the NMOS transistor MN110 is connected to the ground voltage terminal GND. A power down signal PDB is input to the gate of the NMOS transistor MN110. The power down signal PDB is a reversed phase signal of the power down signal PD. The capacitor C302 is connected between the gate and the source of the PMOS transistor MP102. The capacitor C304 is connected between the gate and the source of the PMOS transistor MP104. The PMOS transistors MP210, MP104, and MP102 and the NMOS transistor MN110 constitute a second current path.

Note that reference symbols of FIG. 9 identical to those of FIG. 7 denote identical or similar elements. The differential amplifier 300 differs from the differential amplifier 200 of the second exemplary embodiment in the point that the capacitors C301 to C304 are connected between the gate and source of the PMOS transistors MP101 to MP104, respectively.

Because these capacitors C301 to C304 are connected with the gate of the PMOS transistors MP101 to MP104, respectively, a rapid change of the gating current of the PMOS transistors MP101 to MP104 generated during operation state change can be suppressed. For example, when a rapid change of the gating current happens in the first and second exemplary embodiments, the flowin and flowout of currents in the corresponding parasitic capacitances may be insufficient to counterbalance the currents. Meanwhile, in the third exemplary embodiment, the capacitors C301 to C304 prevent a rapid change of the gating current which facilitates the above-mentioned counterbalancing of the currents. As a result, the change in potential of the input terminals IT and IB decreases compared with the first and second exemplary embodiments. Therefore, the noise generated in the input terminals IT and IB can further be reduced. Further, it is possible to design these capacitors C301 to C304 with a very small capacitance value of about 50 f[F] to 100 f[F], for instance. Therefore, an increase in circuit area has a small influence on the chip in the semiconductor integrated circuit where the differential amplifier 300 is mounted.

Figure 10:
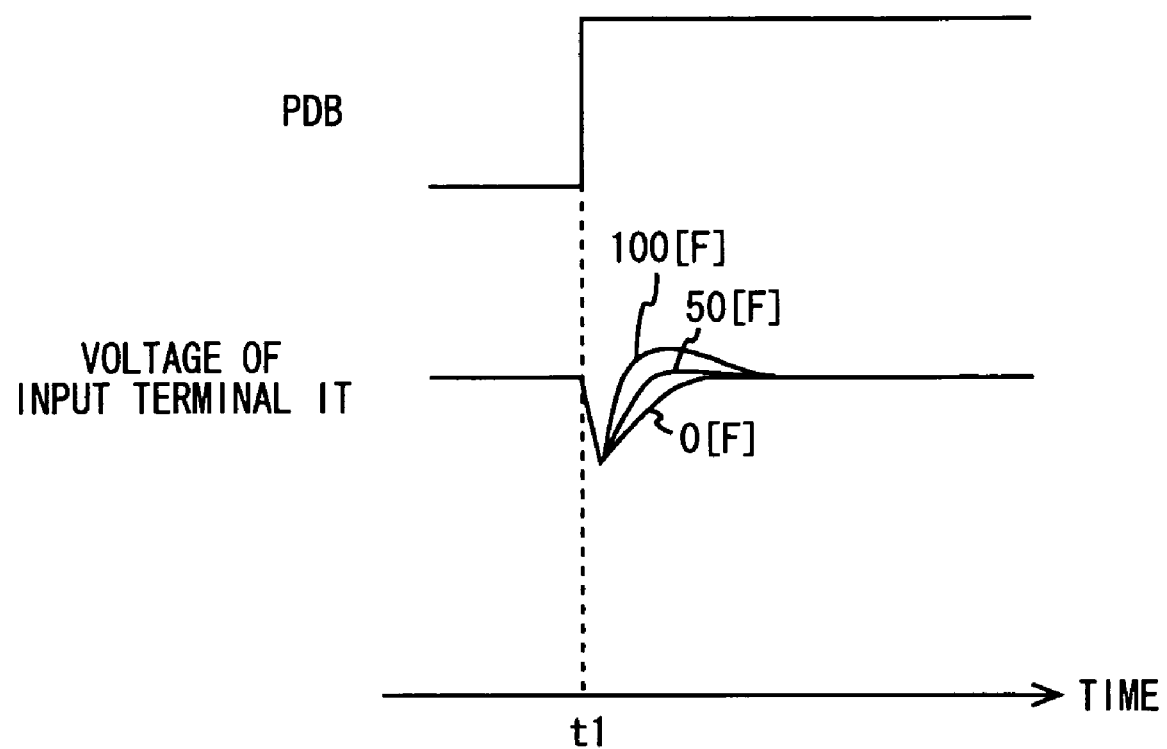
FIG. 10 is a timing diagram for explaining advantageous effect of the differential amplifier in accordance with the third exemplary embodiment of the present invention.

In addition, the amount of generated noise may vary different according to the difference of the input voltage of the input signals IT and IB. However, the amount of the noise generated in the input terminals IT and IB can be reduced by adjusting the capacitance values of the capacitors C301 to C304 in the differential amplifier 300 of the third exemplary embodiment. FIG. 10 shows the voltage value of the input terminal IT when the capacitance values of the capacitors C303 and C304 are changed into 0 f[F], 50 f[F], and 100 f[F], for instance. Note that the amount of noise in the voltage value of the input terminal IT can be further reduced by further changing the capacitance values of the capacitors C301 and C302. Thus, the optimum capacitance value for minimizing amount of the noise generated in the input terminals IT and IB can be obtained by changing the capacitance value of the capacitors C301 to C304. Moreover, even if at least one of the capacitors C301 to C304 is connected, an advantageous effect of reducing the noise can be achieved. For instance, when the signal to be input to the input terminal IB is fixed to the ground voltage GND or the power-supply voltage VDD and the amplitude of the signal to be input to the input terminal IT is changed, only the capacitor C301 is connected. Adjustment of the capacitance value of the capacitor C301 makes it possible to decrease the amount of the noise in the voltage value of the input terminal IT. Moreover, the capacitors C301 and C304 may be similarly connected. Adjustment of the capacitance values of the capacitor C301 and C304 make it possible to decrease the amount of the noise of the voltage value in the input terminal IT.

Figure 11:
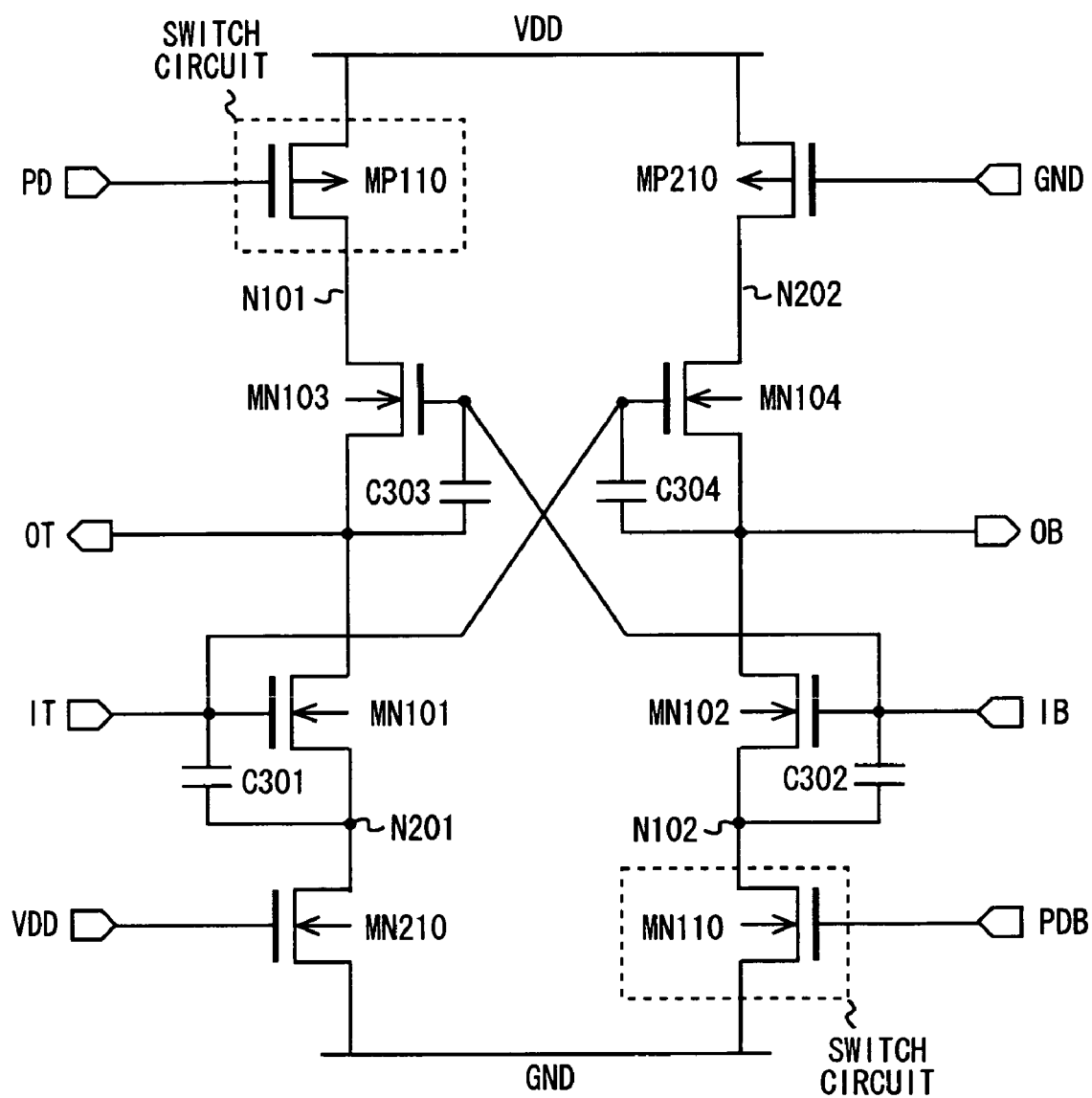
FIG. 11 shows another configuration of a differential amplifier in accordance with the third exemplary embodiment of the present invention.
Figure 12:
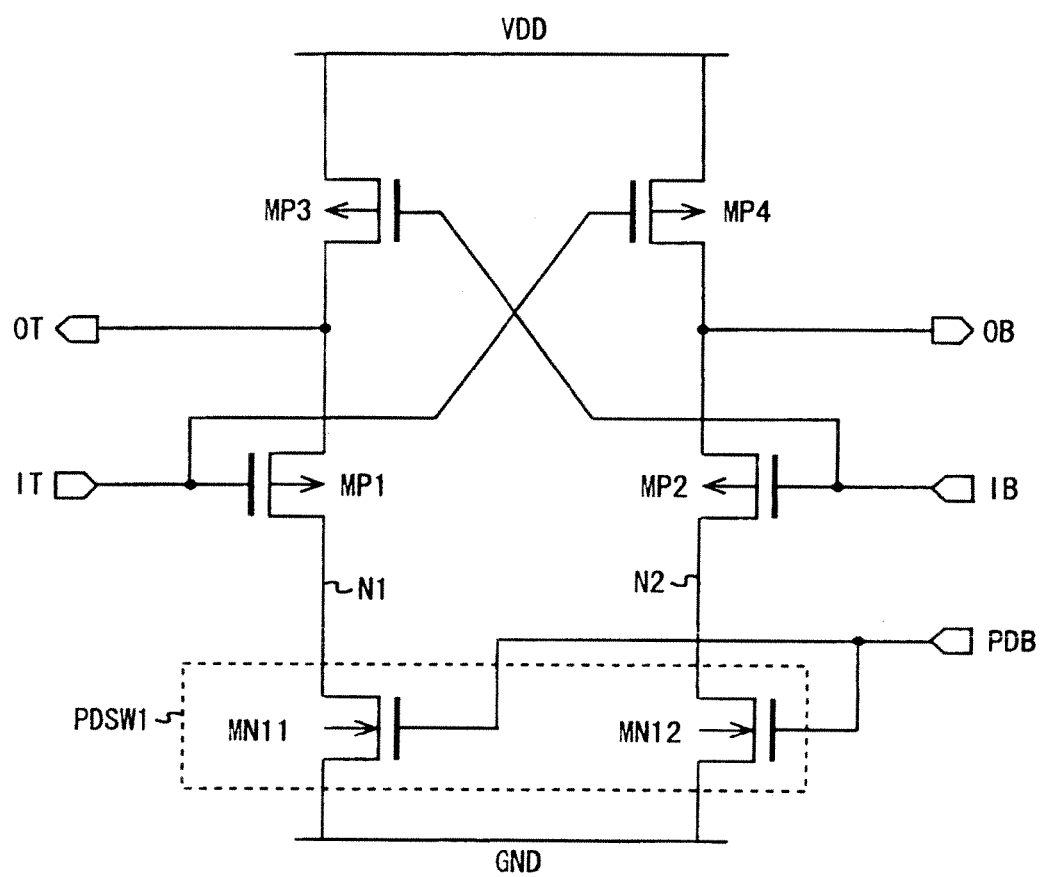
FIG. 12 shows a configuration of a differential amplifier in accordance with a related art.
Figure 13:
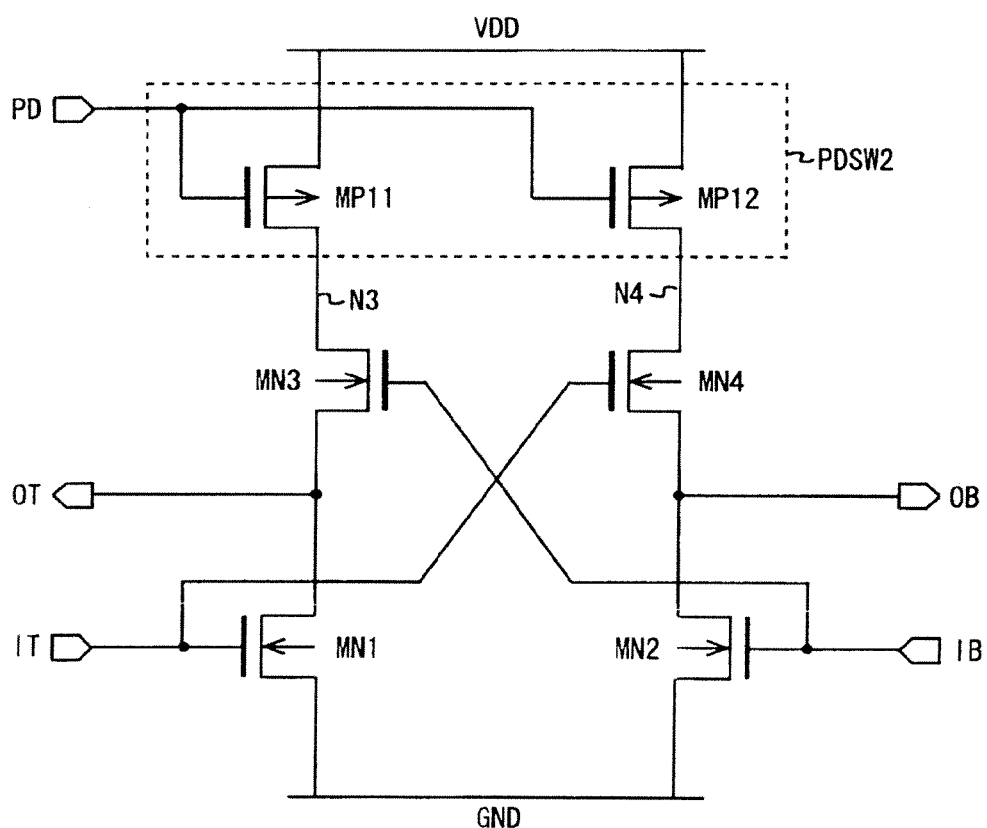
FIG. 13 shows a configuration of a differential amplifier in accordance with a related art.
Figure 14:
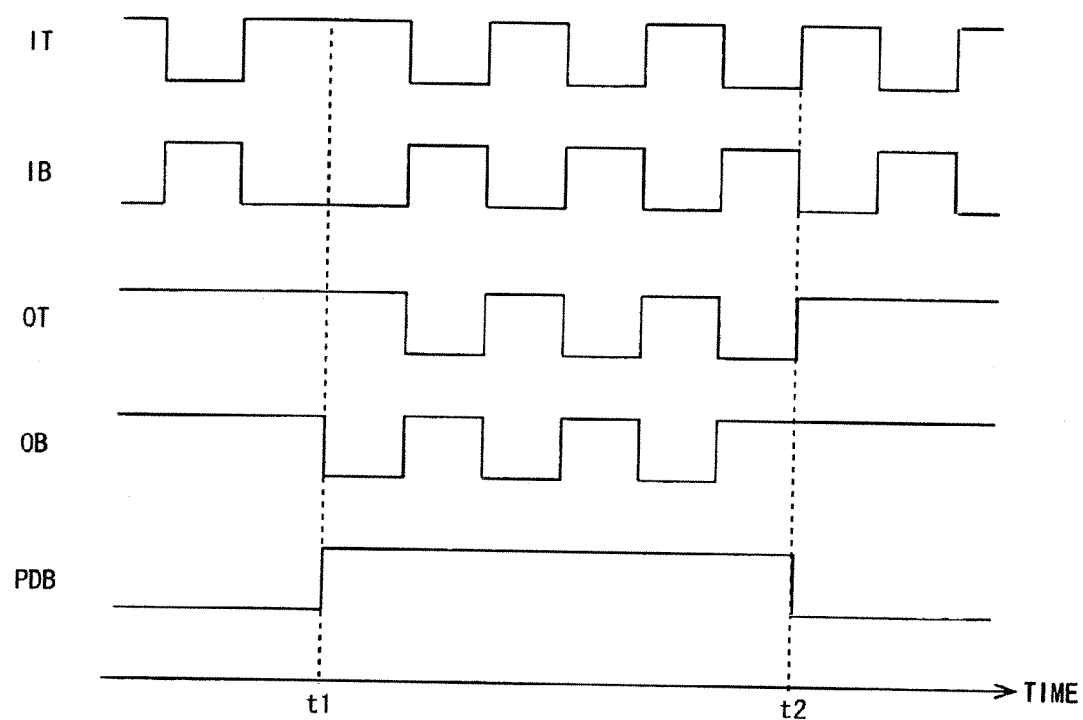
FIG. 14 is a timing diagram showing operation of a differential amplifier in accordance with the related art.
Figure 15:
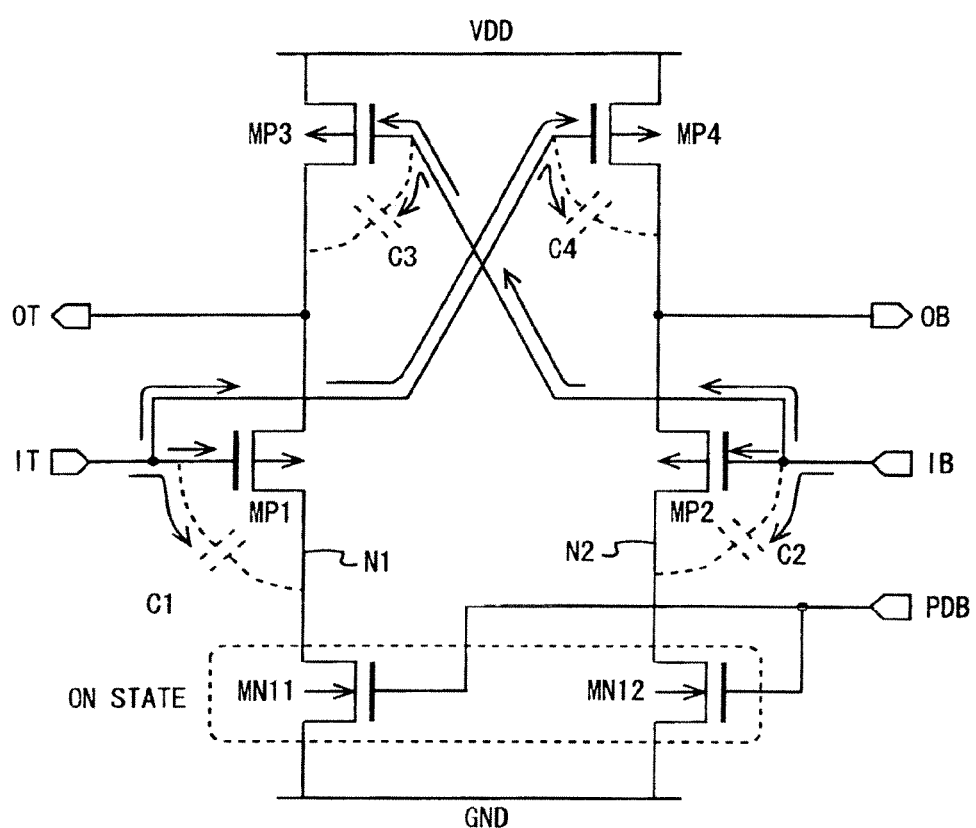
FIG. 15 is a schematic diagram for explaining a problem of a differential amplifier in accordance with the related art.
Figure 16:
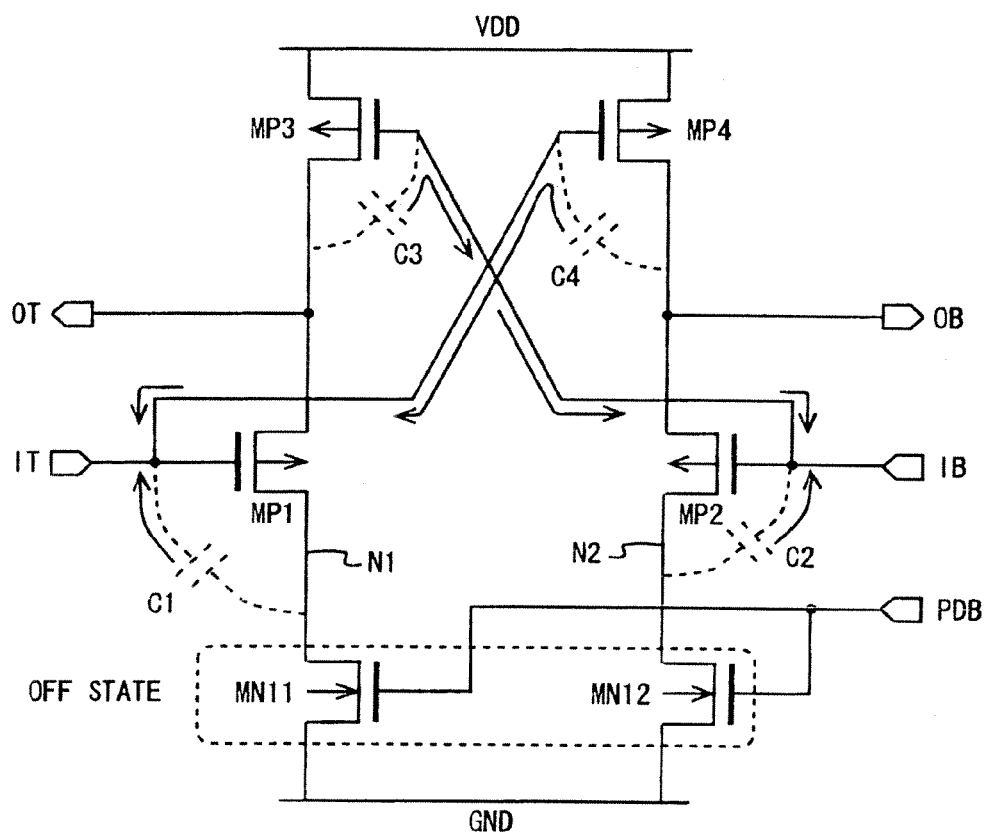
FIG. 16 is a schematic diagram for explaining a problem of a differential amplifier in accordance with the related art.
Figure 17:
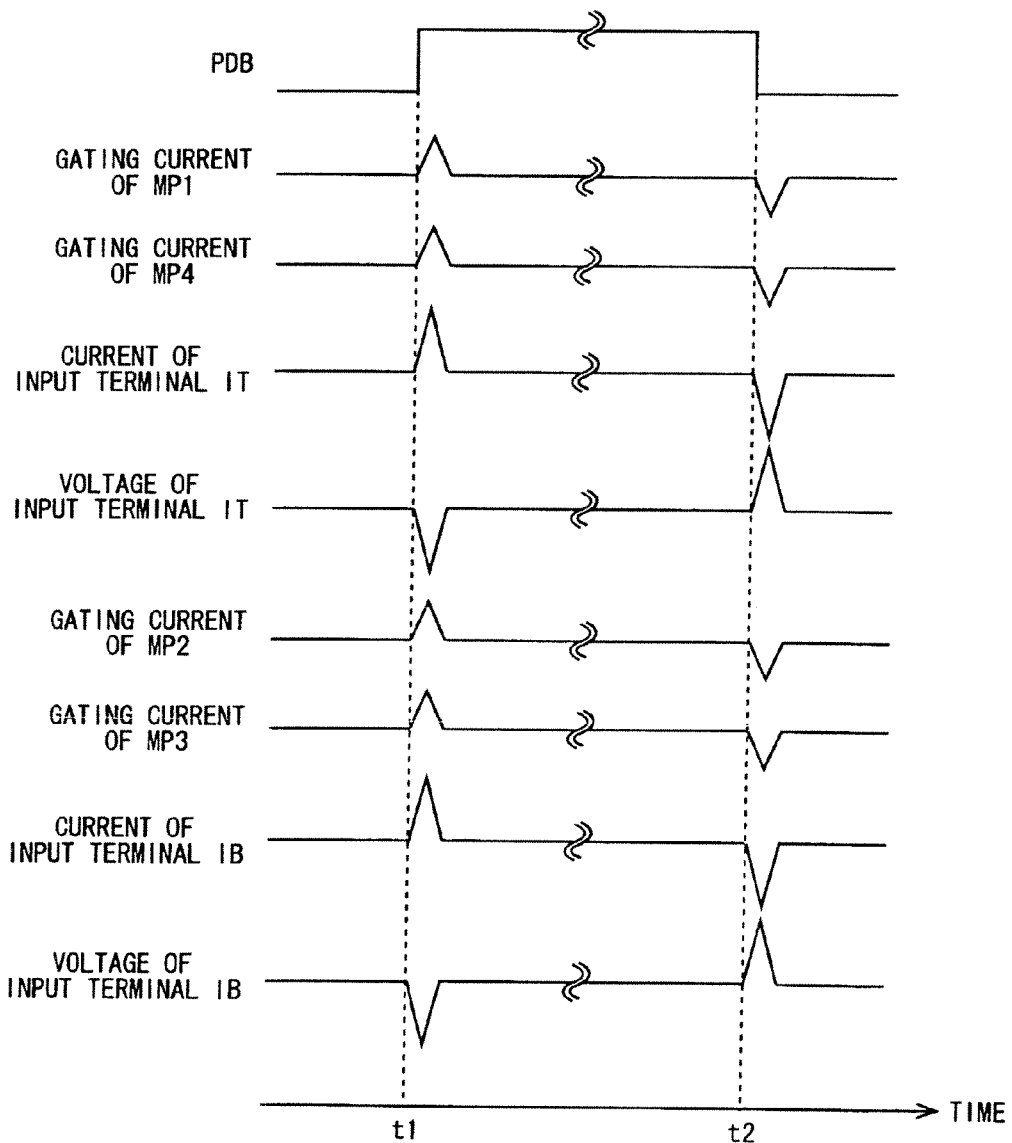
FIG. 17 is a timing diagram for explaining a problem of a differential amplifier in accordance with the related art.

Further, FIG. 11 shows a configuration of a differential amplifier 301 in which the conductivity type of the MOS transistors of the differential amplifier 300 of FIG. 9 is reversed. As shown in FIG. 11, the differential amplifier 301 includes NMOS transistors MN101 to MN104, MN110, and MN210, PMOS transistors MP110 and MP210, capacitors C301 to C304.

The source of the PMOS transistor MP110 is connected to the power-supply voltage terminal VDD, and the drain of the PMOS transistor MP110 is connected to the node N101. The power down signal PD is input to the gate of the PMOS transistor MP110. The drain of the NMOS transistor MN103 is connected to the node N101, the source of the NMOS transistor MN103 is connected to the output terminal OT, and the gate of the NMOS transistor MN103 is connected to the input terminal IB. The drain of the NMOS transistor MN101 is connected to the output terminal OT, the source of the NMOS transistor MN101 is connected to the node N201, and the gate of the NMOS transistor MN101 is connected to the input terminal IT. The drain of the NMOS transistor MN210 is connected to the node N201, and the source of the NMOS transistor MN210 is connected to the ground voltage terminal GND. The power-supply voltage VDD is input to the gate of the NMOS transistor MN210. The capacitor C301 is connected between the gate and the source of the NMOS transistor MN101. The capacitor C303 is connected between the gate and the source of the NMOS transistor MN103. The PMOS transistor MP110 and the NMOS transistors MN103, MN101, and MN210 constitute the first current path.

The source of the PMOS transistor MP210 is connected to the power-supply voltage terminal VDD, and the drain of the PMOS transistor MP210 is connected to the node N202. The ground voltage GND is input to the gate of the PMOS transistor MP210. The drain of the NMOS transistor MN104 is connected to the node N202, the source of the NMOS transistor MN104 is connected to the output terminal OB, and the gate of the NMOS transistor MN104 is connected to the input terminal IT. The drain of the NMOS transistor MN102 is connected to the output terminal OB, the source of the NMOS transistor MN102 is connected to the node N102, and the gate of the NMOS transistor MN102 is connected to the input terminal IB. The drain of the NMOS transistor MN110 is connected to the node N102, and the source of the NMOS transistor MN110 is connected to the ground voltage terminal GND. The power down signal PDB is input to the gate of the NMOS transistor MN110. The power down signal PDB is a reversed phase signal of the power down signal PD. The capacitor C302 is connected between the gate and the source of the NMOS transistor MN102. The capacitor C304 is connected between the gate and the source of the NMOS transistor MN104. The PMOS transistors MP210 and the NMOS transistors MN104, MN102, and MN110 constitute the second current path.

Note that reference symbols of FIG. 11 identical to those of FIGS. 8 and 9 denote identical or similar elements. The differential amplifier 301 has a configuration in which the PMOS transistors MP101 to MP104 of the differential amplifier 300 are replaced with the NMOS transistors MN101 to MN104, respectively. Further, the differential amplifier 301 differs from the differential amplifier 201 of the second exemplary embodiment in the point that the capacitors C301 to C304 are connected between the gate and source of the NMOS transistors MN101 to MN104, respectively.

Because these capacitors C301 to C304 are connected with the gates of the NMOS transistors MN101 to MN104, respectively, a rapid change of the gating current of the NMOS transistors MN101 to MN104 generated during operation state change can be suppressed. The gating current, the change of which is suppressed, allows the corresponding parasitic capacitances to counterbalance the flow-in current and flow-out current as described in the first and second exemplary embodiments. As a result, as with the differential amplifier 300, the change in potential of the input terminals IT and IB decreases compared with the first and second exemplary embodiments. Therefore, the noise generated in the input terminals IT and IB can be further reduced. Other effects are also similar to those of the differential amplifier 300.

Note that the present invention is not limited to the above exemplary embodiments and can be modified in various manners without departing from the scope of the present invention. For example, in the third exemplary embodiment, only the capacitors C301 and C302 may be provided. Alternatively, only the capacitors C303 and C304 may be provided in the third exemplary embodiment. In the configuration of the first exemplary embodiment, the capacitors C301 to C304 may be connected between the gate and source of the PMOS transistors MP101 to MP104 like in the third exemplary embodiment. Further, the capacitors C301 to C304 may be connected between the gate and the drain. While the first and second current paths are composed of the MOS transistors in the first and second exemplary embodiments, the MOS transistors may be replaced with bipolar transistors.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

The first to third exemplary embodiments can be combined as desirable by one of ordinary skill in the art.

What is claimed is:

1. A differential amplifier, comprising:
   a first current path that is connected between a first power-supply terminal and a second power-supply terminal, and outputs one of differential output signals; and
   a second current path that is connected between the first power-supply terminal and the second power-supply terminal, and outputs the other of the differential output signals, wherein
   the first current path includes:
      a first transistor that is selectively interconnected between the first power-supply terminal and a first output terminal that outputs one of the differential output signals, and has a control terminal receiving one of the differential input signals;
      a second transistor that is connected between the second power-supply terminal and the first output terminal, and has a control terminal receiving the other of the differential input signals; and
      a first switch circuit that is connected between the first power-supply terminal and the first transistor, and
   the second current path includes:
      a third transistor that is selectively interconnected between the second power-supply terminal and a second output terminal that outputs the other of the differential output signals, and has a control terminal receiving one of the differential input signals;
      a fourth transistor that is connected between the first power-supply terminal and the second output terminal, and has a control terminal receiving the other of the differential input signal; and
      a second switch circuit that is connected between the second power-supply terminal and the third transistor, and
   a drive state of each of the first and second switch circuits is controlled by a control signal.

2. The differential amplifier according to claim 1, wherein the first to fourth transistors comprise transistors of a first conductivity type.

3. The differential amplifier according to claim 2, wherein the first switch circuit includes a fifth transistor of the first conductivity type, the fifth transistor is connected between the first power-supply terminal and the first transistor, and has a control terminal receiving one of a positive phase signal and a reversed phase signal of the control signal,
the second switch circuit includes a sixth transistor of a second conductivity type, and
the sixth transistor is connected between the second power-supply terminal and the third transistor, and has a control terminal receiving the other of the positive phase signal and the reversed phase signal of the control signal.

4. The differential amplifier according to claim 3, wherein the first current path further includes a seventh transistor of the second conductivity type,
the seventh transistor is connected between the second power-supply terminal and the second transistor, and has a control terminal supplied with a voltage of the first power-supply terminal,
the second current path further includes an eighth transistor of the first conductivity type, and
the eighth transistor is connected between the first power-supply terminal and the fourth transistor, and has a control terminal supplied with a voltage of the second power-supply terminal.

5. The differential amplifier according to claim 4, wherein the seventh transistor has a size substantially equal to a size of the sixth transistor, and
the eighth transistor has a size substantially equal to a size of the fifth transistor.

6. The differential amplifier according to claim 1, wherein at least one of the first to fourth transistors is connected to a capacitor, the capacitor being connected between a control terminal and one of one terminal and the other terminal of the at least one transistor.

7. The differential amplifier according to claim 6, wherein the capacitor has a capacitance value of 100 f[F] or less.

8. A differential amplifier comprising:
   a first current path that is connected between a first power-supply and a second power-supply, and outputs one of differential output signals; and
   a second current path that is connected between the first power-supply and the second power-supply, and outputs the other of the differential output signals, wherein
   the first current path includes:
      a first transistor that is selectively interconnected between the first power-supply and a first output terminal that outputs one of the differential output signals, and has a control terminal receiving one of the differential input signals;
      a second transistor that is connected between the second power-supply and the first output terminal, and has a control terminal receiving the other of the differential input signals; and
      a first switch circuit that is connected between the first power-supply and the first transistor;
   the second current path includes:
      a third transistor that is selectively interconnected between the second power-supply and a second output terminal that outputs the other of the differential output signals, and has a control terminal receiving one of the differential input signals;
      a fourth transistor that is connected between the first power-supply and the second output, and has a control terminal receiving the other of the differential input signals; and
      a second switch circuit that is connected between the second power-supply and the third transistor, and a drive state of each of the first and second switch circuits is controlled by a control signal.

9. The differential amplifier according to claim 8, wherein the first to fourth transistors comprise transistors of a first conductivity type.

10. The differential amplifier according to claim 9, wherein
the first switch circuit includes a fifth transistor of the first conductivity type,
the fifth transistor is connected between the first power-supply and the first transistor, and has a control terminal receiving one of a positive phase signal and a reversed phase signal of the control signal,
the second switch circuit includes a sixth transistor of a second conductivity type, and
the sixth transistor is connected between the second power-supply and the third transistor, and has a control terminal receiving the other of the positive phase signal and the reversed phase signal of the control signal.

11. The differential amplifier according to claim 10, wherein
the first current path further includes a seventh transistor of the second conductivity type,
the seventh transistor is connected between the second power-supply and the second transistor, and has a control terminal supplied with a voltage of the first power-supply,
the second current path further includes an eighth transistor of the first conductivity type, and
the eighth transistor is connected between the first power-supply and the fourth transistor, and has a control terminal supplied with a voltage of the second power-supply.

12. The differential amplifier according to claim 11, wherein
the seventh transistor has a size substantially equal to a size of the sixth transistor, and
the eighth transistor has a size substantially equal to a size of the fifth transistor.

* * * * *